(12) United States Patent
Taguchi (10) Patent No.: US 11,545,961 B2
(45) Date of Patent: Jan. 3, 2023

(54) MULTIPLEXER AND COMMUNICATION APPARATUS

(71) Applicant: Murata Manufacturing Co., Ltd., Nagaokakyo (JP)

(72) Inventor: Tomoko Taguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 845 days.

(21) Appl. No.: 16/400,112

(22) Filed: May 1, 2019

(65) Prior Publication Data
US 2019/0363695 A1 Nov. 28, 2019

(30) Foreign Application Priority Data
May 23, 2018 (JP) .............................. JP2018-099050

(51) Int. Cl.
*H03H 9/64* (2006.01)
*H03H 9/02* (2006.01)
*H03H 9/70* (2006.01)

(52) U.S. Cl.
CPC ...... *H03H 9/6406* (2013.01); *H03H 9/02543* (2013.01); *H03H 9/02614* (2013.01); *H03H 9/70* (2013.01)

(58) Field of Classification Search
CPC ............... H03H 9/02; H03H 9/64; H03H 9/70
See application file for complete search history.

(56) References Cited

U.S. PATENT DOCUMENTS

| 7,944,325 | B2* | 5/2011 | Korden | ................... | H03H 9/725 |
| | | | | | 333/132 |
| 9,083,314 | B2* | 7/2015 | Tsurunari | ............... | H03H 9/725 |
| 9,160,304 | B2* | 10/2015 | Mori | ........................ | H03H 9/54 |
| 9,680,446 | B2* | 6/2017 | Yasuda | ................ | H03H 9/6483 |

(Continued)

FOREIGN PATENT DOCUMENTS

| CN | 107735948 A | 2/2018 |
| JP | 2010-041141 A | 2/2010 |

(Continued)

OTHER PUBLICATIONS

Office Action in CN201910426995.0, dated Oct. 21, 2022, 7 pages.

*Primary Examiner* — Samuel S Outten
*Assistant Examiner* — Alan Wong
(74) *Attorney, Agent, or Firm* — Keating & Bennett, LLP (57) ABSTRACT

A multiplexer includes a first transmission filter connected to a common terminal, a reception filter, a second transmission filter, and a multilayer substrate. The first transmission filter includes a first parallel-arm resonator connected to a first parallel-arm terminal and a second parallel-arm resonator connected to a second parallel-arm terminal. The second transmission filter includes a third parallel-arm resonator connected to a third parallel-arm terminal and a fourth parallel-arm resonator connected to a fourth parallel-arm terminal. The first to fourth parallel-arm resonators are surface-mounted on a main surface of the multilayer substrate. The second and third parallel-arm terminals are grounded on any dielectric layer from the main surface to an n-th dielectric layer of the multilayer substrate and the first and fourth parallel-arm terminals are isolated from each other on the dielectric layers from the main surface to the n-th dielectric layer.

20 Claims, 5 Drawing Sheets

(56) References Cited

U.S. PATENT DOCUMENTS

| | | | |
|---|---|---|---|
| 9,887,686 B2* | 2/2018 | Kuwahara | H03H 9/059 |
| 9,929,770 B2* | 3/2018 | Onodera | H03H 9/6483 |
| 10,367,475 B2* | 7/2019 | Caron | H03H 9/725 |
| 10,580,750 B2* | 3/2020 | Yamauchi | H01L 24/17 |
| 10,873,352 B2* | 12/2020 | Nishikawa | H04B 1/0057 |
| 11,108,379 B2* | 8/2021 | Mazotta | H03H 9/725 |
| 2005/0264375 A1 | 12/2005 | Ikuta et al. | |
| 2010/0026419 A1 | 2/2010 | Hara et al. | |
| 2016/0142040 A1 | 5/2016 | Yasuda | |
| 2017/0033765 A1 | 2/2017 | Moriya et al. | |
| 2018/0109243 A1 | 4/2018 | Takamine | |

FOREIGN PATENT DOCUMENTS

| | | |
|---|---|---|
| KR | 10-2006-0048139 A | 5/2006 |
| KR | 10-2016-0029829 A | 3/2016 |
| KR | 10-2017-0015186 A | 2/2017 |
| KR | 10-2018-0003626 A | 1/2018 |
| WO | 2013011649 A1 | 1/2013 |

* cited by examiner

MULTIPLEXER AND COMMUNICATION APPARATUS

CROSS REFERENCE TO RELATED APPLICATIONS

This application claims the benefit of priority to Japanese Patent Application No. 2018-099050 filed on May 23, 2018. The entire contents of this application are hereby incorporated herein by reference.

BACKGROUND OF THE INVENTION

1. Field of the Invention

The present invention relates to a multiplexer and a communication apparatus.

2. Description of the Related Art

Mobile phones are required to support multiple frequency bands and multiple radio systems using one terminal, that is, to have multiband and multimode support in recent years. In order to achieve such support, a multiplexer that demultiplexes and/or multiplexes high-frequency signals in multiple frequency bands is disposed immediately beneath one antenna. This multiplexer has a configuration in which multiple filters using the respective frequency bands as pass bands are connected to a common terminal.

Japanese Unexamined Patent Application Publication No. 2010-041141 (FIG. 28) discloses a demultiplexer having a configuration in which a surface-acoustic-wave transmission filter and a reception filter are connected to an antenna terminal and these filters are surface-mounted on a multilayer substrate. All parallel-arm resonators of the reception filter are commonly connected to a ground pattern on a die-attach layer disposed immediately beneath a filter chip. This configuration enables attenuation characteristics of the reception filter to be improved.

However, when the number of filters connected to the antenna terminal is increased, as in a triplexer and a quadplexer, in conjunction with the progress of the multiband and multimode support, leakage and interference of high-frequency signals easily occur especially from a transmission path on which the high-frequency signals of one frequency band are transmitted to a reception path on which the high-frequency signals of another frequency band are received through a transmission path on which the high-frequency signals of the other frequency band are transmitted. This reduces the reception sensitivity on the reception path of the other frequency band. In this case, commonly connecting all of the resonators to be grounded on a ground layer closer to the filter chip, as in Japanese Unexamined Patent Application Publication No. 2010-041141, improves the attenuation characteristics of the respective filters but strengthens the coupling between the filters via the ground layer. Accordingly, the leakage and the interference of the high-frequency signals via the ground layer easily occur to cause a problem, for example, in that cross-isolation between the transmission filter on which the high-frequency signals of one frequency band are transmitted and the reception filter on which the high-frequency signals of another frequency band are received is degraded.

SUMMARY OF THE INVENTION

Preferred embodiments of the present invention provide multiplexers each having improved cross-isolation between the filters while the attenuation characteristics of the respective filters are ensured, and communication apparatuses including such multiplexers.

According to a preferred embodiment of the present invention, a multiplexer includes a common terminal; a first terminal; a second terminal; a third terminal; a first transmission filter that is disposed between the common terminal and the first terminal and that uses a transmission band of a first frequency band as a pass band; a first reception filter that is disposed between the common terminal and the second terminal and that uses a reception band of the first frequency band as the pass band; a second transmission filter that is disposed between the common terminal and the third terminal and that uses a transmission band of a second frequency band different from the first frequency band as the pass band; and a multilayer substrate that includes a first main surface and a second main surface and that includes a multilayer body including a plurality of dielectric layers on which conductive patterns are provided. The first transmission filter includes a first parallel-arm resonator connected between a first path between the common terminal and the first terminal and a first parallel-arm terminal, and a second parallel-arm resonator connected between the first path and a second parallel-arm terminal. The second transmission filter includes a third parallel-arm resonator connected between a second path between the common terminal and the third terminal and a third parallel-arm terminal, and a fourth parallel-arm resonator connected between the second path and a fourth parallel-arm terminal. The multilayer substrate includes the first parallel-arm resonator, the second parallel-arm resonator, the third parallel-arm resonator, and the fourth parallel-arm resonator, which are surface-mounted on the first main surface. The second parallel-arm terminal and the third parallel-arm terminal are grounded on any dielectric layer from the first main surface to an n-th (n is a natural number) dielectric layer of the multilayer substrate. The first parallel-arm terminal and the fourth parallel-arm terminal are isolated from each other on the dielectric layers from the first main surface to the n-th dielectric layer of the multilayer substrate.

According to preferred embodiments of the present invention, it is possible to provide multiplexers each having improved cross-isolation between the filters while the attenuation characteristics of the respective filters are ensured, and communication apparatuses including such multiplexers.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will herein be described in detail with reference to the drawings. The preferred embodiments and modifications described below indicate comprehensive or specific examples. Numerical values, shapes, materials, components, the arrangement of the components, the connection structure of the components, and other features and elements, which are indicated in the preferred embodiments and the modifications described below, are only examples and are not intended to limit the scope of the present invention. Among the components in the preferred embodiments and the modifications described below, the components that are not described in the independent claims are described as optional components. In addition, the sizes or the ratios of the sizes of the components illustrated in the drawings are not necessarily strictly indicated.

First Preferred Embodiment

Figure 1:
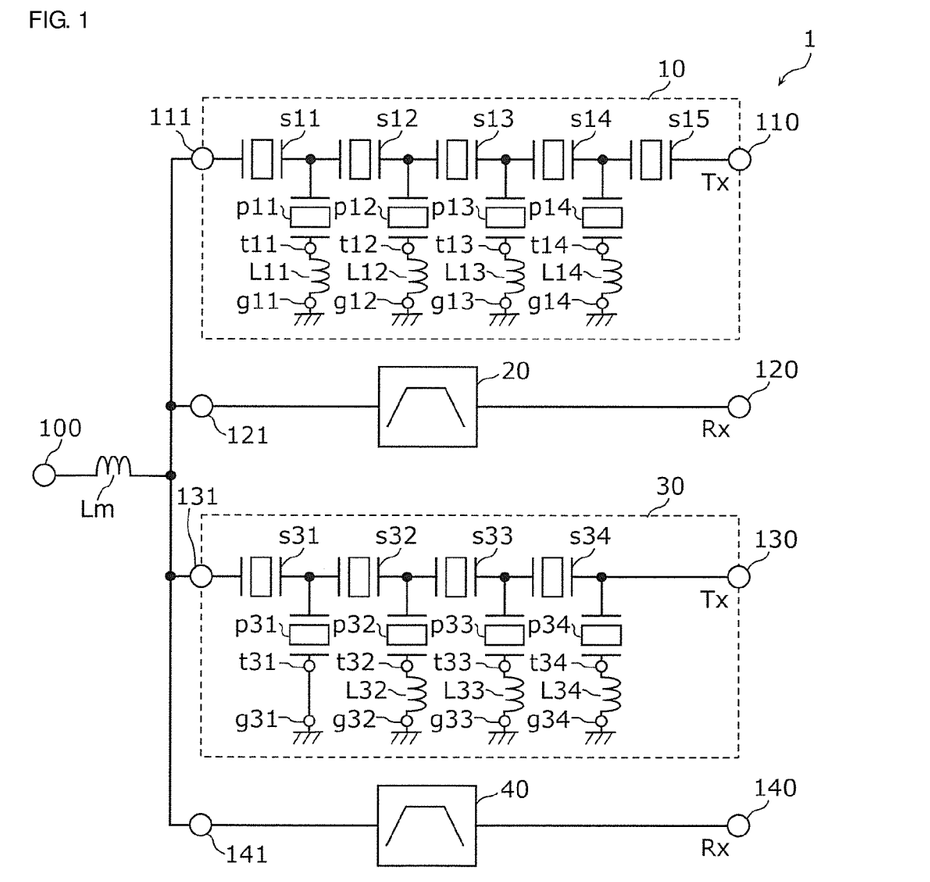
FIG. 1 is a diagram illustrating a circuit configuration of a multiplexer according to a first preferred embodiment of the present invention.

FIG. 1 is a diagram illustrating a circuit configuration of a multiplexer 1 according to a first preferred embodiment of the present invention. Referring to FIG. 1, the multiplexer 1 includes a common terminal 100, a first terminal 110, a second terminal 120, a third terminal 130, a fourth terminal 140, transmission filters 10 and 30, reception filters 20 and 40, and an inductor Lm.

The transmission filter 10 is disposed between the first terminal 110 and an output terminal 111 and is a first transmission filter using a transmission band of BandC (a first frequency band) as a pass band. The output terminal 111 is connected to the common terminal 100 with the inductor Lm interposed therebetween.

The transmission filter 10 includes series-arm resonators s11, s12, s13, s14, and s15, parallel-arm resonators p11, p12, p13, and p14, and inductors L11, L12, L13, and L14.

The series-arm resonators s11 to s15 are first series-arm resonators disposed on a first path between the common terminal 100 and the first terminal 110.

The parallel-arm resonator p11 is a first parallel-arm resonator connected between the first path and a parallel-arm terminal t11 (a first parallel-arm terminal). The parallel-arm resonator p12 is a second parallel-arm resonator connected between the first path and a parallel-arm terminal t12 (a second parallel-arm terminal). The parallel-arm resonator p13 is the second parallel-arm resonator connected between the first path and a parallel-arm terminal t13 (the second parallel-arm terminal). The parallel-arm resonator p14 is the second parallel-arm resonator connected between the first path and a parallel-arm terminal t14 (the second parallel-arm terminal).

In other words, among the parallel-arm resonators p11, p12, p13, and p14 of the transmission filter 10, one parallel-arm resonator p11 is referred to as the first parallel-arm resonator and the remaining parallel-arm resonators p12 to p14 are referred to as the second parallel-arm resonators. In the first preferred embodiment, the parallel-arm resonator p11 is closest to the common terminal.

One end of the inductor L11 is connected to the parallel-arm terminal t11 and the other end thereof is connected to a ground terminal g11. One end of the inductor L12 is connected to the parallel-arm terminal t12 and the other end thereof is connected to a ground terminal g12. One end of the inductor L13 is connected to the parallel-arm terminal t13 and the other end thereof is connected to a ground terminal g13. One end of the inductor L14 is connected to the parallel-arm terminal t14 and the other end thereof is connected to a ground terminal g14.

In the above configuration, the transmission filter 10 is a ladder band pass filter including the series-arm resonators and the parallel-arm resonators.

In the transmission filter 10, at least two inductors, among the inductors L11 to L14, may be commonly used. Specifically, at least two parallel-arm terminals, among the parallel-arm terminals t11 to t14, may be connected to each other, the inductors connected to the at least two parallel-arm terminals may be commonly used, and at least two ground terminals connected to the inductors that are commonly used may be connected to each other. This configuration enables the frequency and the attenuation of an attenuation pole of the transmission filter 10 and insertion loss and ripples in the pass band to be adjusted.

The transmission filter 10 may preferably be, for example, any of a surface acoustic wave filter, a boundary acoustic wave filter, an elastic wave filter using bulk acoustic waves (BAWs), an LC resonant filter, and a dielectric filter. The surface acoustic waves also include, for example, surface waves, Love waves, leaky waves, Rayleigh waves, leaky surface acoustic waves (SAWs), pseudo SAWs, and plate waves.

It is sufficient for the transmission filter 10 to include at least two parallel-arm resonators: the parallel-arm resonators p11 and p14, and the transmission filter 10 may not include the series-arm resonators s11 to s15, the parallel-arm resonators p12 and p13, and the inductors L11 to L14.

The reception filter 20 is disposed between an input terminal 121 and the second terminal 120 and is a first reception filter using a reception band of BandC (the first frequency band) as the pass band. The input terminal 121 is connected to the common terminal 100 with the inductor Lm interposed therebetween.

The reception filter 20 is not limited to any of the surface acoustic wave filter, the elastic wave filter using the BAWs, the LC resonant filter, and the dielectric filter, and may be, for example, an LC filter. The reception filter 20 may have an arbitrary filter structure.

The transmission filter 10 and the reception filter 20 may be a duplexer capable of concurrently transmitting and receiving the high-frequency signals in BandC (the first frequency band).

The transmission filter 30 is disposed between the third terminal 130 and an output terminal 131 and is a second transmission filter using a transmission band of BandA (a second frequency band) as the pass band. The output terminal 131 is connected to the common terminal 100 with the inductor Lm interposed therebetween.

The transmission filter 30 includes series-arm resonators s31, s32, s33, and s34, parallel-arm resonators p31, p32, p33, and p34, and inductors L32, L33, and L34.

The series-arm resonators s31 to s34 are second series-arm resonators disposed on a second path between the common terminal 100 and the third terminal 130.

The parallel-arm resonator p31 is a third parallel-arm resonator connected between the second path and a parallel-arm terminal t31 (a third parallel-arm terminal). The parallel-arm resonator p32 is the third parallel-arm resonator connected between the second path and a parallel-arm terminal t32 (the third parallel-arm terminal). The parallel-arm resonator p33 is the third parallel-arm resonator connected between the second path and a parallel-arm terminal t33 (the third parallel-arm terminal). The parallel-arm resonator p34 is a fourth parallel-arm resonator connected between the second path and a parallel-arm terminal t34 (a fourth parallel-arm terminal).

In other words, among the parallel-arm resonators p31, p32, p33, and p34 of the transmission filter 30, one parallel-arm resonator p34 is referred to as the fourth parallel-arm resonator and the remaining parallel-arm resonators p31 to p33 are referred to as the third parallel-arm resonators. In the first preferred embodiment, the parallel-arm resonator p34 is preferably the parallel-arm resonator closest to the third terminal.

One end of the inductor L32 is connected to the parallel-arm terminal t32 and the other end thereof is connected to a ground terminal g32. One end of the inductor L33 is connected to the parallel-arm terminal t33 and the other end thereof is connected to a ground terminal g33. One end of the inductor L34 is connected to the parallel-arm terminal t34 and the other end thereof is connected to a ground terminal g34.

In the above configuration, the transmission filter 30 is a ladder band pass filter including the series-arm resonators and the parallel-arm resonators.

In the transmission filter 30, an inductor L31 may be disposed between the parallel-arm terminal t31 and a ground terminal g31. In addition, among the inductors L31 to L34, at least two inductors may be commonly used. Specifically, at least two parallel-arm terminals, among the parallel-arm terminals t31 to t34, may be connected to each other, the inductors connected to the at least two parallel-arm terminals may be commonly used, and at least two ground terminals connected to the inductors that are commonly used may be connected to each other. This configuration enables the frequency and the attenuation of the attenuation pole of the transmission filter 30 and the insertion loss and the ripples in the pass band to be adjusted.

The transmission filter 30 may preferably be, for example, any of a surface acoustic wave filter, a boundary acoustic wave filter, an elastic wave filter using BAWs, an LC resonant filter, and a dielectric filter. The surface acoustic waves also include, for example, surface waves, Love waves, leaky waves, Rayleigh waves, leaky SAWs, pseudo SAWs, and plate waves.

It is sufficient for the transmission filter 30 to include at least two parallel-arm resonators: the parallel-arm resonators p31 and p34, and the transmission filter 30 may not include the series-arm resonators s31 to s34, the parallel-arm resonators p32 to p33, and the inductors L32 to L34.

The reception filter 40 is disposed between an input terminal 141 and the fourth terminal 140 and is a filter using a reception band of BandA (the second frequency band) as the pass band. The input terminal 141 is connected to the common terminal 100 with the inductor Lm interposed therebetween.

The reception filter 40 is not limited to any of the surface acoustic wave filter, the elastic wave filter using the BAWs, the LC resonant filter, and the dielectric filter and may be an LC filter. The reception filter 40 may have an arbitrary filter structure.

The transmission filter 30 and the reception filter 40 may preferably be a duplexer capable of concurrently transmitting and receiving the high-frequency signals in BandA (the second frequency band).

The inductor Lm is an impedance matching element disposed in series between the common terminal 100 and the output terminals 111 and 131 and the input terminals 121 and 141. The inductor Lm may be disposed between the common terminal 100 and ground.

In the multiplexer 1 according to the first preferred embodiment, the inductor Lm, the fourth terminal 140, and the reception filter 40 may not be provided.

With the above circuit configuration, the multiplexer 1 is capable of concurrently transmitting, concurrently receiving, and concurrently transmitting and receiving the high-frequency signals in BandC (the first frequency band) and the high-frequency signals in BandA (the second frequency band) (capable of performing carrier aggregation (CA)).

Figure 2:
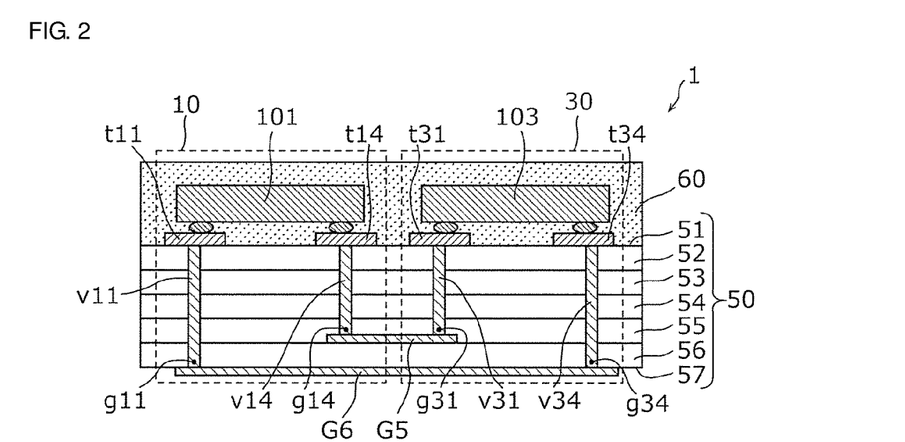
FIG. 2 is a cross-sectional configuration diagram of the multiplexer according to the first preferred embodiment of the present invention.

FIG. 2 is a cross-sectional configuration diagram of the multiplexer 1 according to the first preferred embodiment. Referring to FIG. 2, the multiplexer 1 further includes a multilayer substrate 50 defining a portion of the transmission filters 10 and 30 and the reception filters 20 and 40 (not illustrated).

The multilayer substrate 50 includes a main surface 51 (a first main surface) and a main surface 57 (a second main surface) and includes a multilayer body including multiple dielectric layers 52 to 56 on which conductive patterns are provided.

The transmission filter 10 preferably includes, for example, an elastic wave resonator including a piezoelectric substrate 101 and interdigital transducer (IDT) electrodes provided on the piezoelectric substrate 101. Connection electrodes that are provided on the piezoelectric substrate 101 and that are connected to the IDT electrodes are face-down connected to electrodes provided on the main surface 51 with bumps or solder interposed therebetween. The electrodes provided on the main surface 51 include the parallel-arm terminals t11 to t14 connected to the parallel-arm resonators p11 to p14, respectively.

The transmission filter 30 preferably includes, for example, an elastic wave resonator including a piezoelectric substrate 103 and IDT electrodes provided on the piezoelectric substrate 103. Connection electrodes that are provided on the piezoelectric substrate 103 and that are connected to the IDT electrodes are face-down connected to electrodes provided on the main surface 51 with bumps or solder interposed therebetween. The electrodes provided on the main surface 51 include the parallel-arm terminals t31 to t34 connected to the parallel-arm resonators p31 to p34, respectively.

In other words, the parallel-arm resonators p11 to p14 and the series-arm resonators s11 to s15 in the transmission filter 10 and the parallel-arm resonators p31 to p34 and the series-arm resonators s31 to s34 in the transmission filter 30 are surface-mounted on the main surface 51 of the multilayer substrate 50.

The piezoelectric substrates 101 and 103 are covered with a resin member 60. The resin member 60 improves the reliability but is not required.

The parallel-arm terminal t11 is connected to the ground terminal g11 via a via conductor v11 passing through the dielectric layers 52 to 56 of the multilayer substrate 50. The parallel-arm terminal t14 is connected to the ground terminal g14 via a via conductor v14 passing through the dielectric layers 52 to 55 of the multilayer substrate 50. The parallel-arm terminal t31 is connected to the ground terminal g31 via a via conductor v31 passing through the dielectric layers 52 to 55 of the multilayer substrate 50. The parallel-arm terminal t34 is connected to the ground terminal g34 via a via conductor v34 passing through the dielectric layers 52 to 56 of the multilayer substrate 50. Other parallel-arm resonators (not illustrated) are connected to other ground terminals (not illustrated) by via conductors passing through the dielectric layers 52 to 55 of the multilayer substrate 50. The inductors L11 to L14 and L32 to L34 illustrated in FIG. 1 may be defined by inductance components of these via conductors. Alternatively, the inductors L11 to L14 and L32 to L34 may be defined by substantially coil-shaped conductive patterns provided on the respective dielectric layers, as described below with reference to FIG. 3A, instead of these via conductors. In the cross-sectional configuration illustrated in FIG. 2, at least the dielectric layers 52 to 54 are layers on which inductors to be connected to the parallel-arm resonators are provided.

The parallel-arm terminal t12 (the second parallel-arm resonator) (not illustrated), the parallel-arm terminal t13 (the second parallel-arm resonator) (not illustrated), and the parallel-arm terminal t14 (the second parallel-arm resonator) in the transmission filter 10 and the parallel-arm terminal t31 (the third parallel-arm resonator), the parallel-arm terminal t32 (the third parallel-arm resonator) (not illustrated), and the parallel-arm terminal t33 (the third parallel-arm resonator) (not illustrated) in the transmission filter 30 are not connected to each other on the layers from the main surface 51 to the third dielectric layer 54 and are grounded with a ground layer G5 provided on the fourth dielectric layer 55 from the main surface 51. In contrast, the parallel-arm terminal t11 (the first parallel-arm resonator) in the transmission filter 10 and the parallel-arm terminal t34 (the fourth parallel-arm resonator) in the transmission filter 30 are isolated from each other on the dielectric layers from the main surface 51 to the fourth dielectric layer.

In other words, the second parallel-arm terminals in the transmission filter 10 and the third parallel-arm terminals in the transmission filter 30 are grounded on any dielectric layer from the main surface 51 to an n-th (n is a natural number) dielectric layer of the multilayer substrate 50, and the first parallel-arm terminal in the transmission filter 10 and the fourth parallel-arm terminal in the transmission filter 30 are isolated from each other on the dielectric layers from the main surface 51 to the n-th dielectric layer of the multilayer substrate 50.

Grounding the two parallel-arm terminals with the ground layer includes a case in which the inductors are disposed between the parallel-arm terminals and the ground layer.

In order to improve attenuation characteristics of the filter including the multiple resonators, it is preferable to connect the parallel-arm terminals to which the respective multiple parallel-arm resonators are connected to the common ground at a shortest distance.

However, in the multiplexer 1 in which the multiple filters each including the multiple resonators are connected to the common terminal 100, when the respective parallel-arm terminals are commonly grounded at a shortest distance, for example, the high-frequency signals of high power leak from the transmission filter 30 to the transmission filter 10 via the ground to which the parallel-arm terminals are commonly connected. In other words, although the attenuation characteristics of each of the transmission filter 10 and the transmission filter 30 are improved, cross-isolation between the transmission filter 10 and the transmission filter 30 is degraded. In this case, for example, the high-frequency signals leak from the transmission filter 30 to the transmission filter 10 and the high-frequency signals that have leaked come around the reception filter 20 using the reception band of the same frequency band as that of the transmission filter 10 as the pass band to reduce the reception sensitivity of the reception filter 20.

In contrast, with the configuration of the multiplexer 1 according to the first preferred embodiment, the parallel-arm terminals t31 to t33 in the transmission filter 30 and the parallel-arm terminals t12 to t14 in the transmission filter 10 are grounded on the fourth dielectric layer 55 from the main surface 51 of the multilayer substrate 50. The parallel-arm terminal t34 in the transmission filter 30 and the parallel-arm terminal t11 in the transmission filter 10 are isolated from each other on the dielectric layers from the main surface 51 to the fourth dielectric layer 55 of the multilayer substrate 50. In other words, the parallel-arm resonators p31 to p33 in the transmission filter 30 and the parallel-arm resonators p12 to p14 in the transmission filter 10 are commonly grounded on the fourth dielectric layer 55 at a shortest distance while the parallel-arm resonator p34 in the transmission filter 30 and the parallel-arm resonator p11 in the transmission filter 10 are isolated from the ground on the dielectric layers at short distances to the fourth dielectric layer. With this configuration, the cross-isolation between the transmission filter 30, and the transmission filter 10 and the reception filter 20 is improved while the attenuation characteristics of each of the transmission filter 10 and the transmission filter 30 are ensured.

In addition, as illustrated in FIG. 2, the parallel-arm resonator p11 (the first parallel-arm resonator) in the transmission filter 10 and the parallel-arm resonator p34 (the fourth parallel-arm resonator) in the transmission filter 30 are grounded with a ground layer G6 provided on the fifth dielectric layer 56 from the main surface 51. In other words, the first parallel-arm terminal in the transmission filter 10 and the fourth parallel-arm terminal in the transmission filter 30 are grounded on any dielectric layer from an (n+1)-th layer to the main surface 57 of the multilayer substrate 50.

With this configuration, since the fourth parallel-arm resonator and the first parallel-arm resonator, which are isolated from the ground on the dielectric layers to the n-th dielectric layer in order to ensure the cross-isolation between the transmission filter 30, and the transmission filter 10 and the reception filter 20, are commonly grounded on any dielectric layer from the (n+1)-th layer to the main surface 57, the attenuation characteristics of each of the transmission filter 10 and the transmission filter 30 are capable of being ensured.

As in the multiplexer 1 according to the first preferred embodiment, the first parallel-arm resonator that is not grounded on any dielectric layer from the main surface 51 to the n-th dielectric layer of the multilayer substrate 50 is preferably the parallel-arm resonator p11 closest to the common terminal 100, among all of the parallel-arm resonators p11 to p14 in the transmission filter 10. In addition, the fourth parallel-arm resonator that is not grounded on any dielectric layer from the main surface 51 to the n-th dielectric layer of the multilayer substrate 50 is preferably the parallel-arm resonator p34 closest to the third terminal 130, among all of the parallel-arm resonators p31 to p34 in the transmission filter 30.

With the above configuration, the parallel-arm resonator p34 closest to the third terminal 130, which is a transmission terminal, is not commonly grounded on the dielectric layers at short distances to the n-th dielectric layer in the transmission filter 30, from which the high-frequency signals that are not necessary for the reception filter 20 are transmitted. Accordingly, since it is possible to reduce or prevent the leakage of the high-frequency signals from a portion near the third terminal 130 through which the high-frequency signal of the highest power flows, among the high-frequency signals passing through the transmission filter 30, to the transmission filter 10, the leakage of the high-frequency signals from the transmission filter 30 to the transmission filter 10 is capable of being more effectively reduced or prevented. In addition, among the parallel-arm resonators of the transmission filter 10, the parallel-arm resonator p11 closest to the reception filter 20 is not commonly grounded on the dielectric layers at short distances to the n-th dielectric layer. Accordingly, the flowing of the leakage components of the high-frequency signals from the transmission filter 30 to the transmission filter 10 into the reception filter 20 is capable of being more effectively reduced or prevented.

Furthermore, when the transmission filters 10 and 30 are ladder filters including the series-arm resonators and the parallel-arm resonators, as in the multiplexer 1 according to the first preferred embodiment, the grounding of the parallel-arm resonators has a large effect on the attenuation characteristics.

With the above configuration, it is possible to ensure both the attenuation characteristics of the transmission filters 10 and 30, which are the ladder filters, and the cross-isolation characteristics between the ladder filters.

Figure 3A:
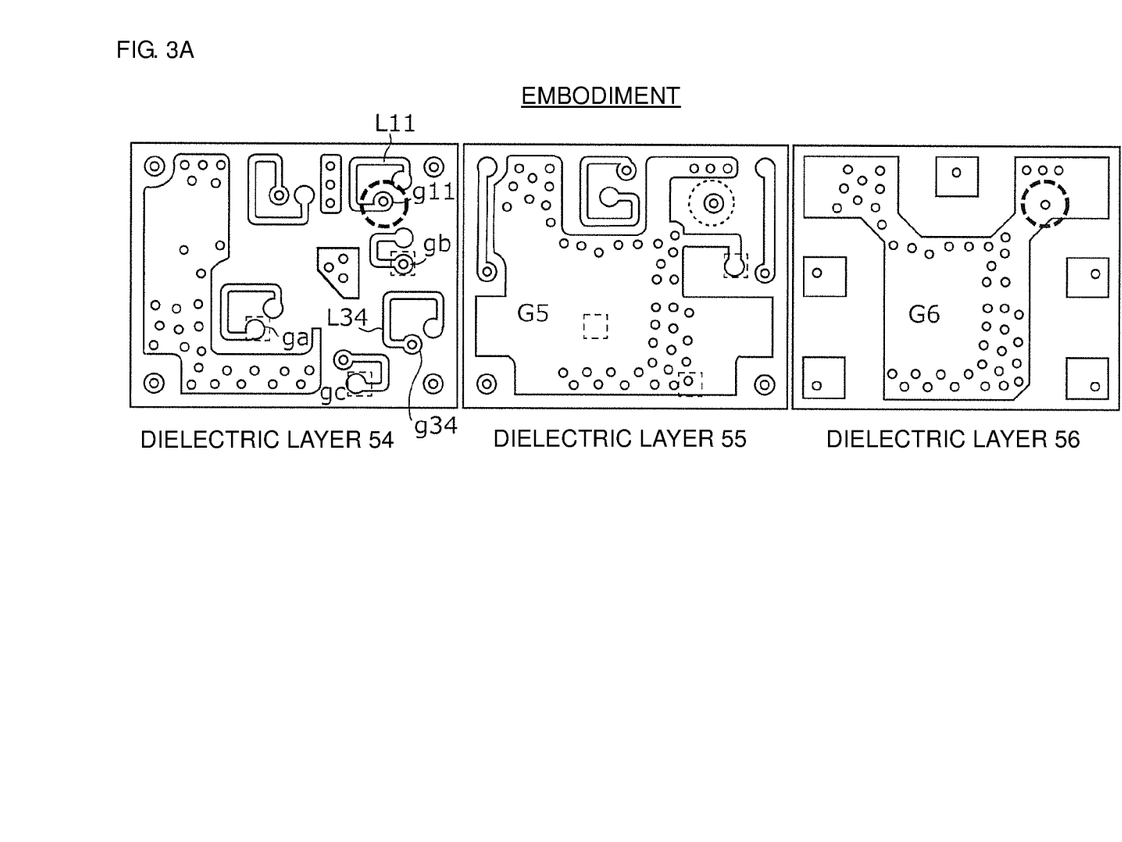
FIG. 3A illustrates conductive patterns on the respective layers of a multilayer substrate of a multiplexer according to a preferred embodiment of the present invention.
Figure 3B:
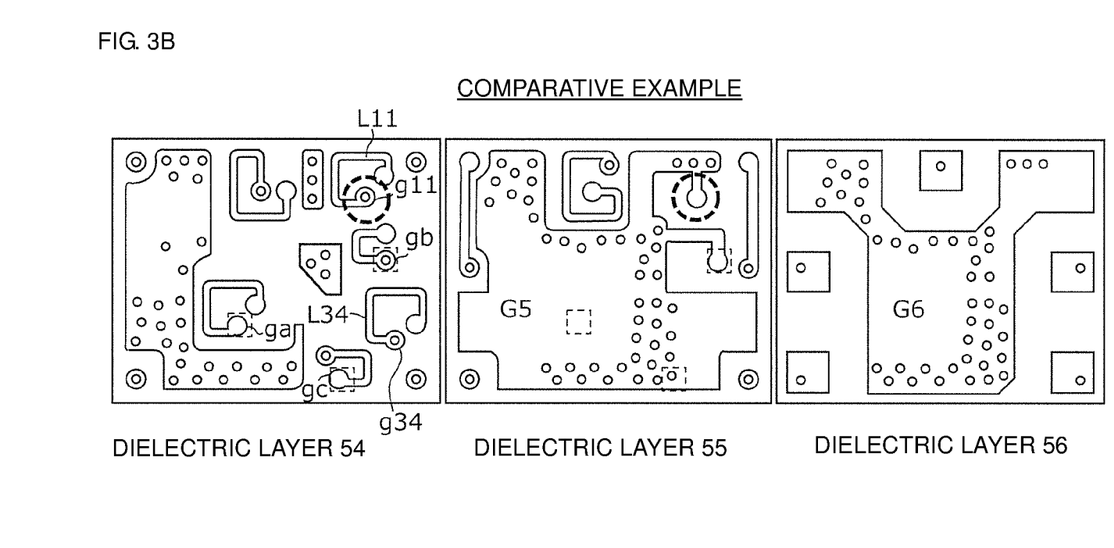
FIG. 3B illustrates conductive patterns on the respective layers of a multilayer substrate of a multiplexer according to a comparative example.

FIG. 3A illustrates conductive patterns on the respective layers of the multilayer substrate 50 of a multiplexer according to a preferred embodiment of the present invention. FIG. 3B illustrates conductive patterns on the respective layers of the multilayer substrate 50 of a multiplexer according to a comparative example. The conductive patterns in a plan view of the dielectric layers 54 to 56, among the dielectric layers 52 to 56 of the multilayer substrate 50 illustrated in FIG. 2, from the main surface 57 side are illustrated in FIGS. 3A and 3B. The multiplexer according to the present preferred embodiment and the multiplexer according to the comparative example have the same or substantially the same circuit configuration illustrated in FIG. 1 but differ from each other in the ground layer to which the ground terminal g11 to which the parallel-arm resonator p11 is connected is connected.

In both of the multiplexers according to the present preferred embodiment and the comparative example, in the dielectric layers 52 to 54, the parallel-arm resonator p11 is connected to the ground terminal g11 via the inductor L11 and the parallel-arm resonator p34 is connected to the ground terminal g34 via the inductor L34, as illustrated in FIGS. 3A and 3B. The inductors L12 to L14 to which the parallel-arm resonators p12 to p14 are connected and the inductors L32 to L34 to which the parallel-arm resonators p32 to p34 are connected are not identified in FIGS. 3A and 3B. The ground terminals to which the parallel-arm resonators p12 to p14 are connected and the ground terminals to which the parallel-arm resonators p32 to p34 are connected are any of ground terminals ga, gb, and gc illustrated in FIGS. 3A and 3B and are partially commonly used.

In the multiplexer according to the present preferred embodiment, as illustrated in FIG. 3A, the ground terminal g11 to which the parallel-arm resonator p11 is connected is not connected to the ground layer G5 provided on the dielectric layer 55 (a broken line circle on the dielectric layer 55 in FIG. 3A) but is connected to the ground layer G6 provided on the dielectric layer (a broken line circle on the dielectric layer 56 in FIG. 3A). In contrast, the ground terminal g34 to which the parallel-arm resonator p34 is connected is connected to the ground layer G5 provided on the dielectric layer 55 and the other ground terminals ga, gb, and gc are also connected to the ground layer G5 provided on the dielectric layer 55.

In other words, the parallel-arm terminals t12 to t14 (the ground terminals g12 to g14) in the transmission filter 10 and the parallel-arm terminals t31 to t33 (the ground terminals g31 to g33) in the transmission filter 30 are grounded on any dielectric layer from the main surface 51 to the fourth dielectric layer while the parallel-arm terminal t11 (the ground terminal g11) in the transmission filter 10 and the parallel-arm terminal t34 (the ground terminal g34) in the transmission filter 30 are isolated from each other on the dielectric layers from the main surface 51 to the fourth dielectric layer.

In addition, the parallel-arm terminal t11 (the ground terminal g11) in the transmission filter 10 and the parallel-arm terminal t34 (the ground terminal g34) in the transmission filter 30 are grounded with the ground layer G6 provided on the fifth dielectric layer 56 from the main surface 51. In other words, the parallel-arm terminal t11 in the transmission filter 10 and the parallel-arm terminal t34 in the transmission filter 30 are grounded on the fifth dielectric layer 56.

In contrast, in the multiplexer according to the comparative example, as illustrated in FIG. 3B, the ground terminal g11 to which the parallel-arm resonator p11 is connected is connected to the ground layer G5 provided on the dielectric layer (a broken line circle on the dielectric layer 55 in FIG. 3B). In addition, the ground terminal g34 to which the parallel-arm resonator p34 is connected is connected to the ground layer G5 provided on the dielectric layer 55 and the other ground terminals ga, gb, and gc are also connected to the ground layer G5 provided on the dielectric layer 55.

In other words, all of the parallel-arm terminals t11 to t14 (the ground terminals g11 to g14) in the transmission filter 10 and all of the parallel-arm terminals t31 to t34 (the ground terminals g31 to g34) in the transmission filter 30 are grounded on any dielectric layer from the main surface 51 to the fourth dielectric layer.

Figure 4:
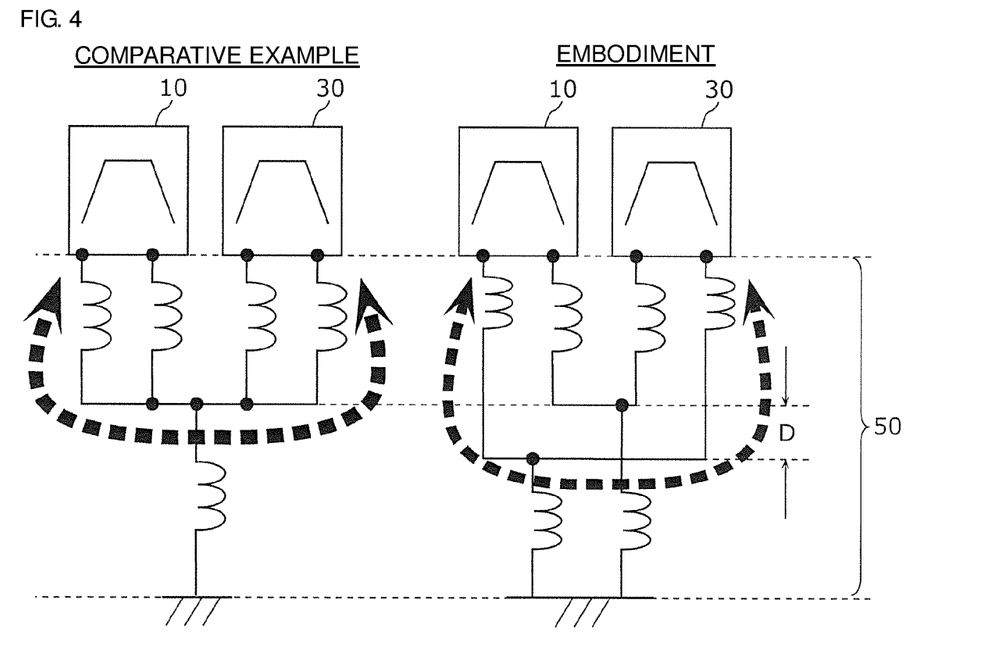
FIG. 4 is a conceptual diagram indicating a result of a comparison between the degree of coupling between transmission filters in the multiplexer according to the comparative example and the degree of coupling between transmission filters in a multiplexer according to a preferred embodiment of the present invention.

FIG. 4 is a conceptual diagram indicating a result of a comparison between the degree of coupling between the transmission filters in the multiplexer according to the comparative example and the degree of coupling between the transmission filters in the multiplexer according to the present preferred embodiment. As illustrated in FIG. 4, in the multiplexer according to the comparative example, all of the parallel-arm resonators of the transmission filters 10 and 30 are grounded on the same dielectric layer. Since this enables the coupling with the ground to be improved via the ground layer to which the parallel-arm resonators are commonly connected, the attenuation characteristics of each of the transmission filter 10 and the transmission filter 30 are capable of being improved. However, the high-frequency signals easily leak between the transmission filter 30 and the transmission filter 10 due to the strong coupling via the ground layer to degrade the cross-isolation between eh transmission filter 30 and the transmission filter 10.

In contrast, in the multiplexer according to the present preferred embodiment, a long distance for commonly grounding portions of the parallel-arm resonators of the transmission filter 10 and portions of the parallel-arm resonators of the transmission filter 30 is ensured while the parallel-arm resonators of the transmission filters 10 and 30 are grounded at a shortest distance. In FIG. 4, the distance for commonly grounding portions of the parallel-arm resonators of the transmission filter 10 and portions of the parallel-arm resonators of the transmission filter 30 is ensured so as to be increased by an amount corresponding to an interlayer distance D. This enables the cross-isolation between the transmission filter 30, and the transmission filter 10 and the reception filter 20 to be improved while the attenuation characteristics of each of the transmission filter 10 and the transmission filter 10 are improved.

Figure 5:
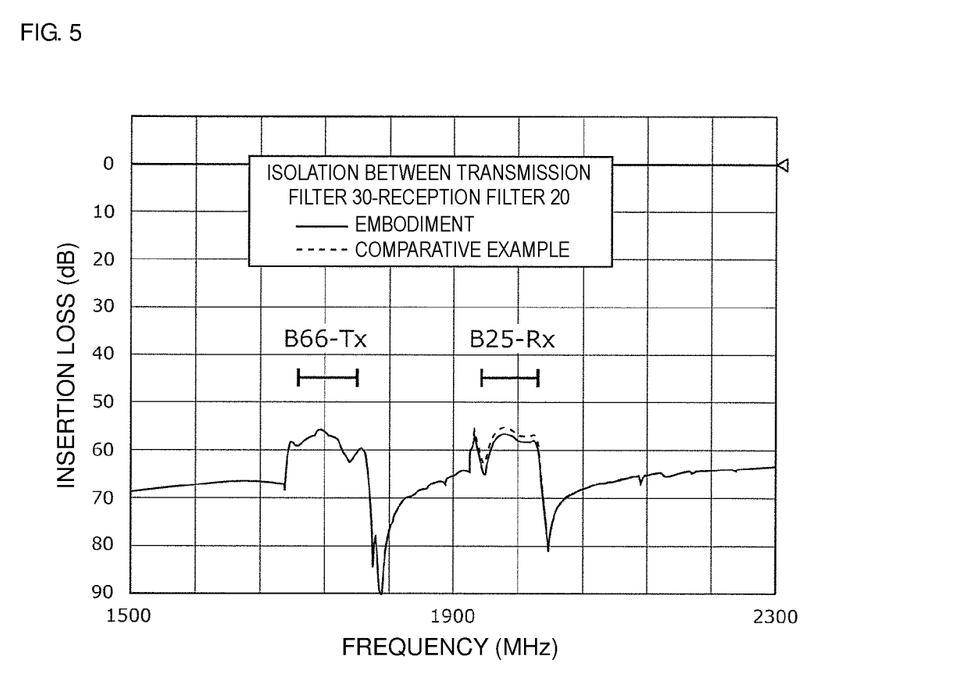
FIG. 5 is a graph indicating a result of comparison between the cross-isolation of a multiplexer according to a preferred embodiment of the present invention and the cross-isolation of the multiplexer according to the comparative example of the present invention.

FIG. 5 is a graph showing a result of a comparison between the cross-isolation of the multiplexer according to the present preferred embodiment and the cross-isolation of the multiplexer according to the comparative example.

It is assumed here that the transmission filter 10 is a band pass filter using a transmission band (for example, about 1,850 MHz to about 1,915 MHz) of Band25 (the first frequency band) of Long Term Evolution (LTE) as the pass band and that the reception filter 20 is a band pass filter using a reception band (for example, about 1,930 MHz to about 1,995 MHz) of Band25 (the first frequency band) of LTE as the pass band.

It is also assumed here that the transmission filter 30 is a band pass filter using a transmission band (for example, about 1,710 MHz to about 1,780 MHz) of Band66 (the second frequency band) of LTE as the pass band and that the reception filter 40 is a band pass filter using a reception band (for example, about 2,110 MHz to about 2,200 MHz) of Band66 (the second frequency band) of LTE as the pass band.

As illustrated in FIG. 5, the multiplexer according to the present preferred embodiment is improved especially in the isolation in the pass band of the reception filter 20, in the isolation between the third terminal 130 and the second terminal 120 (the cross-isolation between the transmission filter 30 and the reception filter 20), compared with the multiplexer according to the comparative example.

Second Preferred Embodiment

In a second preferred embodiment of the present invention, a multiplexer 1A to which a switch circuit to select a combination of the frequency bands in which the CA is performed is further included in the multiplexer 1 according to the first preferred embodiment and a communication apparatus 6 including the multiplexer 1A are described.

Figure 6:
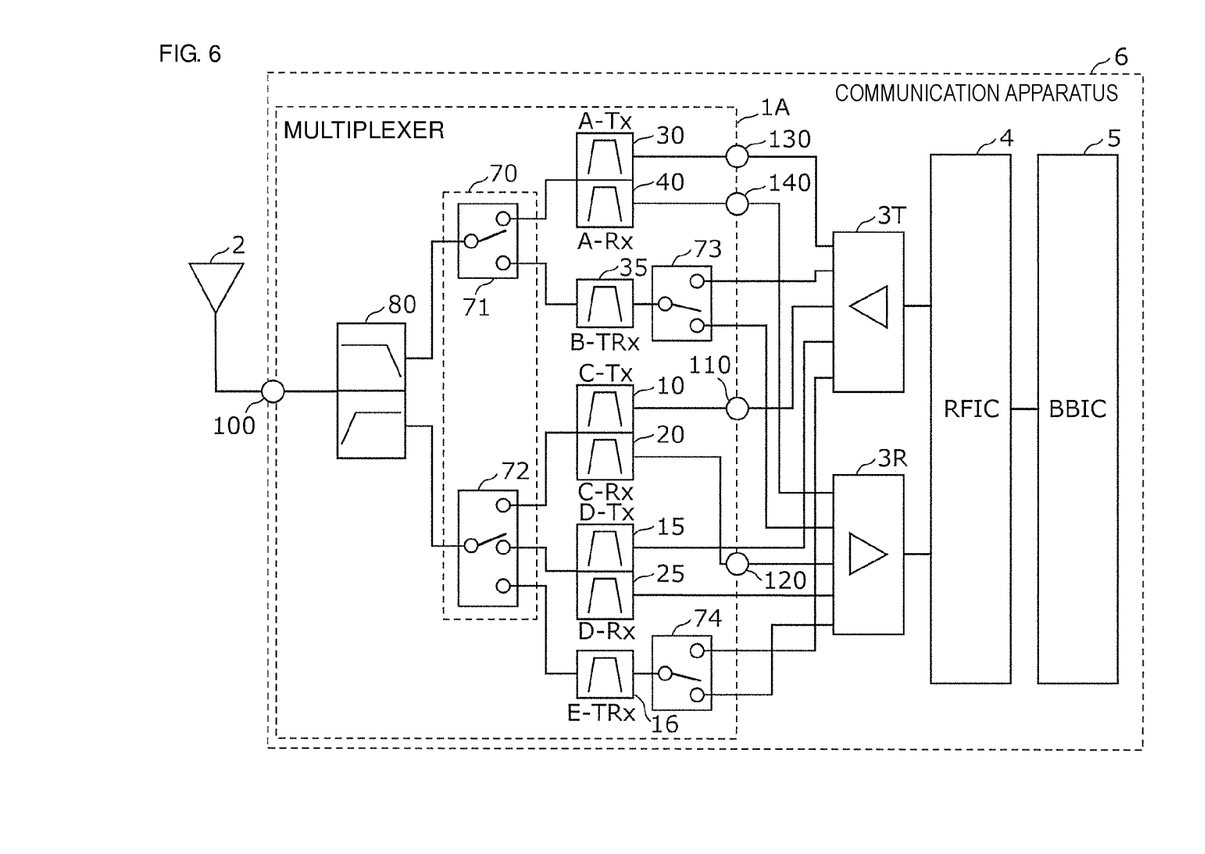
FIG. 6 is a diagram illustrating a circuit configuration of a communication apparatus according to a second preferred embodiment of the present invention.

FIG. 6 is a diagram illustrating a circuit configuration of the communication apparatus 6 according to the second preferred embodiment. Referring to FIG. 6, the communication apparatus 6 includes the multiplexer 1A, a transmission amplifier circuit 3T, a reception amplifier circuit 3R, a radio-frequency (RF) signal processing circuit (RF integrated circuit (RFIC) 4, and a baseband signal processing circuit (BBIC) 5.

The multiplexer 1A further includes a transmission filter 15, a reception filter 25, transmission-reception filters 16 and 35, a switch circuit 70, switches 73 and 74, and a diplexer 80, in addition to the components in the multiplexer 1 according to the first preferred embodiment. The inductor Lm may be provided in series between the common terminal 100 and the diplexer 80.

The transmission filter 10 is disposed between the transmission amplifier circuit 3T and the switch circuit 70 and is the first transmission filter using the transmission band of BandC (the first frequency band) as the pass band.

The reception filter 20 is disposed between the switch circuit 70 and the reception amplifier circuit 3R and is the first reception filter using the reception band of BandC (the first frequency band) as the pass band.

The transmission filter 30 is disposed between the transmission amplifier circuit 3T and the switch circuit 70 and is the second transmission filter using the transmission band of BandA (the second frequency band) as the pass band.

The reception filter 40 is disposed between the switch circuit 70 and the reception amplifier circuit 3R and is a filter using the reception band of BandA (the second frequency band) as the pass band.

The transmission filter 15 is disposed between the transmission amplifier circuit 3T and the switch circuit 70 and is a filter using a transmission band of BandD as the pass band.

The reception filter 25 is disposed between the switch circuit 70 and the reception amplifier circuit 3R and is a filter using a reception band of BandD as the pass band.

The transmission-reception filter 16 is disposed between the switch circuit 70 and the switch 74 and is a filter using a transmission-reception band of BandE as the pass band.

The transmission-reception filter 35 is disposed between the switch circuit 70 and the switch 73 and is a filter using a transmission-reception band of BandB as the pass band.

The switch circuit 70 includes a switch 71 and a switch 72. The switch 71 exclusively switches between a connection between the transmission filter 30 and the reception filter 40 and the diplexer 80 and a connection between the transmission-reception filter 35 and the diplexer 80. The switch 71 is preferably, for example, a single pole double throw (SPDT) switch. The switch 72 exclusively switches between a connection between the transmission filter 10 and the reception filter 20 and the diplexer 80, a connection between the transmission filter 15 and the reception filter 25 and the diplexer 80, and a connection between the transmission-reception filter 16 and the diplexer 80. The switch 72 is preferably, for example, a single pole 3 throw (SP3T) switch.

The switch 73 exclusively switches between a connection between the transmission-reception filter 35 and the transmission amplifier circuit 3T and a connection between the transmission-reception filter 35 and the reception amplifier circuit 3R. The switch 73 is preferably, for example, an SPDT switch. The switch exclusively switches between a connection between the transmission-reception filter 16 and the transmission amplifier circuit 3T and a connection between the transmission-reception filter 16 and the reception amplifier circuit 3R. The switch 74 is preferably, for example, an SPDT switch.

With the above configuration of the switch circuit 70, the multiplexer 1A is capable of concurrently transmitting, concurrently receiving, or concurrently transmitting-receiving the high-frequency signal in either of BandA and BandB and the high-frequency signal in any of BandC, BandD, and BandE.

The switch circuit 70 is not limited to the two switches 71 and 72 and it is sufficient for the switch circuit 70 to be a circuit capable of concurrently connecting two or more paths. For example, the switch circuit 70 may have a configuration in which multiple single pole single throw (SPST) switches are disposed in parallel.

The diplexer 80 is disposed between the common terminal 100 and the switch circuit 70 and includes a low pass filter and a high pass filter. The low pass filter is connected to the common terminal 100 and the switch 71 and causes the high-frequency signals in a low-frequency side band group including BandA and BandB to be transmitted through. The high pass filter is connected to the common terminal 100 and the switch 72 and causes the high-frequency signals in a high-frequency side band group including BandC, BandD, and BandE to be transmitted through. With this configuration, the diplexer 80 demultiplexes and multiplexes the high-frequency signals in the low-frequency side band group and the high-frequency signals in the high-frequency side band group.

The diplexer 80 is not required for the multiplexer 1A. The diplexer 80 may demultiplex and multiplex the high-frequency signals in the two frequency band groups, as in the second preferred embodiment, or may be a multiplexer that demultiplexes and multiplexes the high-frequency signals in three or more frequency band groups.

The number of frequency bands transmitted through the multiplexer 1A according to the second preferred embodiment is not limited to five including BandA to BandE. It is sufficient for the multiplexer 1A to transmit through the high-frequency signals in two or more frequency bands.

In the multiplexer 1A according to the second preferred embodiment, as illustrated in FIG. 2, the parallel-arm resonators p12 to p14 (the second parallel-arm resonators) in the transmission filter 10 and the parallel-arm resonators p31 to p33 (the third parallel-arm resonators) in the transmission filter 30 are grounded with the ground layer G5 provided on the fourth dielectric layer 55 from the main surface 51, as in the multiplexer 1 according to the first preferred embodiment. In other words, the second parallel-arm terminals in the transmission filter 10 and the third parallel-arm terminals in the transmission filter 30 are grounded on any dielectric layer from the main surface 51 to the n-th dielectric layer of the multilayer substrate 50. In contrast, the parallel-arm resonator p11 (the first parallel-arm resonator) in the transmission filter 10 and the parallel-arm resonator p34 (the fourth parallel-arm resonator) in the transmission filter 30 are grounded with the ground layer G6 provided on the fifth dielectric layer 56 from the main surface 51. In other words, the first parallel-arm terminal in the transmission filter 10 and the fourth parallel-arm terminal in the transmission filter 30 are grounded on any dielectric layer from the (n+1)-th dielectric layer to the main surface 57 of the multilayer substrate 50.

With the above configuration, for example, when the high-frequency signal transmitted through the transmission filter and the high-frequency signal transmitted through the transmission filter 30 are concurrently transmitted, it is possible to reduce or prevent leakage of the high-frequency signals from the transmission filter 30 to the transmission filter 10 through the switch circuit 70. In other words, it is possible to ensure both the attenuation characteristics of the transmission filters 10 and 30 and the reception filter 20 and the cross-isolation characteristics between the transmission filter 30 and the reception filter 20.

The transmission amplifier circuit 3T amplifies a high-frequency transmission signal supplied from the RFIC 4 and supplies the amplified high-frequency transmission signal to the multiplexer 1A. The reception amplifier circuit 3R amplifies a high-frequency reception signal that is received with an antenna element 2 and that passed through the multiplexer 1A and supplies the amplified high-frequency reception signal to the RFIC 4.

The RFIC 4 is an RF signal processing circuit that processes the high-frequency signal to supply the processed high-frequency signal to the transmission amplifier circuit 3T and that processes the high-frequency signal supplied from the reception amplifier circuit 3R. Specifically, the RFIC 4 performs signal processing, such as down-conversion, for example, to the high-frequency reception signal supplied from the antenna element 2 via the multiplexer 1A and the reception amplifier circuit 3R and supplies the high-frequency reception signal subjected to the signal processing to the BBIC 5. In addition, the RFIC 4 performs signal processing, such as up-conversion, for example, to the transmission signal supplied from the BBIC 5 and supplies the high-frequency transmission signal subjected to the signal processing to the transmission amplifier circuit 3T and the multiplexer 1A.

In the second preferred embodiment, the RFIC 4 also defines and functions as a controller that controls connection of the switches 71 to 74 in the multiplexer 1A based on the band (frequency band) that is used. Specifically, the RFIC 4 switches connection of the switches 71 to 74 in response to a control signal (not illustrated). The controller may be provided outside the RFIC 4 and, for example, may be provided in the multiplexer 1A or the BBIC 5.

With the above configuration, it is possible to provide the communication apparatus 6 having the improved cross-isolation between the filters through which the high-frequency signals in different frequency bands are transmitted while ensuring the attenuation characteristics of the respective filters composing the multiplexer 1A.

Although the multiplexers and the communication apparatuses according to the preferred embodiments of the present invention are described above using examples, the present invention is not limited to the above preferred embodiments and examples. Other preferred embodiments achieved by combining arbitrary components in the above preferred embodiments and examples, modifications resulting from making various changes conceived by the persons skilled in the art to the above preferred embodiments without departing from the scope and sprit of the present invention, and various devices incorporating the multiplexers and the communication apparatuses according to preferred embodiments of the present invention are also included in the present invention.

In addition, for example, matching elements, such as inductors and capacitors, and switch circuits may be connected between the respective components in the multiplexers and the communication apparatuses according to the preferred embodiments and examples. The inductors may include wiring inductors defined by lines connecting the respective components.

Preferred embodiments of the present invention are widely usable in communication devices, such as mobile phones, for example, as the multiplexers and the communication apparatuses applicable to a multiband system performing the CA.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multiplexer comprising:
  a common terminal;

a first terminal;
a second terminal;
a third terminal;
a first transmission filter disposed between the common terminal and the first terminal and using a transmission band of a first frequency band as a pass band;
a first reception filter disposed between the common terminal and the second terminal and using a reception band of the first frequency band as the pass band;
a second transmission filter disposed between the common terminal and the third terminal and using a transmission band of a second frequency band different from the first frequency band as the pass band; and
a multilayer substrate including a first main surface and a second main surface and including a multilayer body including a plurality of dielectric layers on which conductive patterns are provided; wherein
the first transmission filter includes:
a first parallel-arm resonator connected between a first path between the common terminal and the first terminal and a first parallel-arm terminal; and
a second parallel-arm resonator connected between the first path and a second parallel-arm terminal;
the second transmission filter includes:
a third parallel-arm resonator connected between a second path between the common terminal and the third terminal and a third parallel-arm terminal; and
a fourth parallel-arm resonator connected between the second path and a fourth parallel-arm terminal;
the multilayer substrate includes the first parallel-arm resonator, the second parallel-arm resonator, the third parallel-arm resonator, and the fourth parallel-arm resonator, which are surface-mounted on the first main surface;
the second parallel-arm terminal and the third parallel-arm terminal are commonly connected to one grounded pattern disposed on a top surface of any dielectric layer of the plurality of dielectric layers from the first main surface to an n-th dielectric layer of the multilayer substrate where n is a natural number; and
the first parallel-arm terminal and the fourth parallel-arm terminal are not connected to any ground pattern disposed on the top surface of the plurality of dielectric layers from the first main surface to the n-th dielectric layer of the multilayer substrate.

2. A communication apparatus comprising:
the multiplexer according to claim 1;
an amplifier circuit connected to the first terminal, the second terminal, and the third terminal; and
a radio-frequency signal processing circuit that processes a high-frequency signal to supply the processed high-frequency signal to the amplifier circuit and that processes a high-frequency signal supplied from the amplifier circuit.

3. The communication apparatus according to claim 2, wherein the first parallel-arm terminal and the fourth parallel-arm terminal are commonly connected to a ground pattern disposed on a top surface of any dielectric layer from an (n+1)-th dielectric layer to the second main surface of the multilayer substrate.

4. The communication apparatus according to claim 2, wherein
the first parallel-arm resonator is closest to the common terminal, among all of the parallel-arm resonators in the first transmission filter; and
the fourth parallel-arm resonator is closest to the third terminal, among all of the parallel-arm resonators in the second transmission filter.

5. The communication apparatus according to claim 2, wherein
the first transmission filter further includes:
a first series-arm resonator disposed on the first path;
the first transmission filter is a ladder filter including the first parallel-arm resonator, the second parallel-arm resonator, and the first series-arm resonator;
the second transmission filter further includes:
a second series-arm resonator disposed on the second path; and
the second transmission filter is a ladder filter including the third parallel-arm resonator, the fourth parallel-arm resonator, and the second series-arm resonator.

6. The communication apparatus according to claim 2, further comprising:
a switch circuit disposed between the common terminal and the first transmission filter, the first reception filter, and the second transmission filter and that is capable of concurrently performing a connection between the common terminal and the first transmission filter and a connection between the common terminal and the second transmission filter.

7. The communication apparatus according to claim 6, wherein the switch circuit includes a first switch performing a connection between the common terminal and the first transmission filter, and a second switch performing a connection between the common terminal and the second transmission filter.

8. The communication apparatus according to claim 2, wherein
the first transmission filter is disposed between the first terminal and a first output terminal; and
the output terminal is connected to the common terminal with an inductor interposed therebetween.

9. The communication apparatus according to claim 2, wherein
the first transmission filter further includes an inductor; and
the inductor includes one end connected to the first parallel-arm terminal and another end connected to a ground terminal.

10. The communication apparatus according to claim 2, wherein
the second transmission filter is disposed between the second terminal and a second output terminal; and
the second output terminal is connected to the common terminal with an inductor interposed therebetween.

11. The communication apparatus according to claim 2, wherein
the second transmission filter further includes an inductor; and
the inductor includes one end connected to the second parallel-arm terminal and another end connected to a ground terminal.

12. The multiplexer according to claim 1, wherein the first parallel-arm terminal and the fourth parallel-arm terminal are commonly connected to a ground pattern disposed on a top surface of any dielectric layer from an (n+1)-th dielectric layer to the second main surface of the multilayer substrate.

13. The multiplexer according to claim 1, wherein
the first parallel-arm resonator is closest to the common terminal, among all of the parallel-arm resonators in the first transmission filter; and the fourth parallel-arm resonator is closest to the third terminal, among all of the parallel-arm resonators in the second transmission filter.

14. The multiplexer according to claim 1, wherein
the first transmission filter further includes:
a first series-arm resonator disposed on the first path;
the first transmission filter is a ladder filter including the first parallel-arm resonator, the second parallel-arm resonator, and the first series-arm resonator;
the second transmission filter further includes:
a second series-arm resonator disposed on the second path; and
the second transmission filter is a ladder filter including the third parallel-arm resonator, the fourth parallel-arm resonator, and the second series-arm resonator.

15. The multiplexer according to claim 1, further comprising:
a switch circuit disposed between the common terminal and the first transmission filter, the first reception filter, and the second transmission filter and that is capable of concurrently performing a connection between the common terminal and the first transmission filter and a connection between the common terminal and the second transmission filter.

16. The multiplexer according to claim 15, wherein the switch circuit includes a first switch performing a connection between the common terminal and the first transmission filter, and a second switch performing a connection between the common terminal and the second transmission filter.

17. The multiplexer according to claim 1, wherein
the first transmission filter is disposed between the first terminal and a first output terminal; and
the output terminal is connected to the common terminal with an inductor interposed therebetween.

18. The multiplexer according to claim 1, wherein
the first transmission filter further includes an inductor; and
the inductor includes one end connected to the first parallel-arm terminal and another end connected to a ground terminal.

19. The multiplexer according to claim 1, wherein
the second transmission filter is disposed between the second terminal and a second output terminal; and
the second output terminal is connected to the common terminal with an inductor interposed therebetween.

20. The multiplexer according to claim 1, wherein
the second transmission filter further includes an inductor; and
the inductor includes one end connected to the second parallel-arm terminal and another end connected to a ground terminal.

* * * * *